United States Patent
Huang et al.

(10) Patent No.: US 11,626,515 B2
(45) Date of Patent: Apr. 11, 2023

(54) HIGH VOLTAGE SEMICONDUCTOR DEVICE INCLUDING BURIED OXIDE LAYER AND METHOD FOR FORMING THE SAME

(71) Applicant: UNITED MICROELECTRONICS CORP., Hsin-Chu (TW)

(72) Inventors: Sheng-Yao Huang, Kaohsiung (TW); Yu-Ruei Chen, New Taipei (TW); Zen-Jay Tsai, Tainan (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 44 days.

(21) Appl. No.: 17/109,153

(22) Filed: Dec. 2, 2020

(65) Prior Publication Data
US 2022/0140139 A1 May 5, 2022

(30) Foreign Application Priority Data
Oct. 29, 2020 (CN) .......................... 202011177946.7

(51) Int. Cl.
*H01L 29/78* (2006.01)
*H01L 21/265* (2006.01)
*H01L 29/06* (2006.01)
*H01L 29/66* (2006.01)
*H01L 21/28* (2006.01)
(Continued)

(52) U.S. Cl.
CPC .... *H01L 29/7816* (2013.01); *H01L 21/26533* (2013.01); *H01L 29/0653* (2013.01); *H01L 29/66681* (2013.01)

(58) Field of Classification Search
CPC ......... H01L 21/76822; H01L 21/76825; H01L 21/76826; H01L 21/76828; H01L 21/76829; H01L 21/02107; H01L 21/02225; H01L 21/02255; H01L 21/26533; H01L 21/42–426; H01L 21/28008; H01L 21/28017; H01L 21/28158; H01L 21/28185; H01L 21/30–32; H01L 21/76267; H01L 29/7816; H01L 29/66681; H01L 29/66659; H01L 29/66674; H01L 29/7801; H01L 29/7835; H01L 27/0922; H01L 29/7812; H01L 29/7824; H01L 29/7833–7836; H01L 27/088; H01L 21/823462; H01L 29/42368; H01L 29/42364; H01L 21/28211; H01L 21/823857;
(Continued)

(56) References Cited

U.S. PATENT DOCUMENTS 5,554,546 A * 9/1996 Malhi ................. H01L 29/7835
438/152
6,593,182 B2 * 7/2003 Chen ............... H01L 21/823462
257/E21.285
(Continued)

*Primary Examiner* — Sonya McCall-Shepard
(74) *Attorney, Agent, or Firm* — Winston Hsu

(57) ABSTRACT

A semiconductor structure includes a substrate, a buried oxide layer formed in the substrate and near a surface of the substrate, a gate dielectric layer formed on the substrate and covering the buried oxide layer, a gate structure formed on the gate dielectric layer and overlapping the buried oxide layer, and a source region and a drain region formed in the substrate and at two sides of the gate structure.

9 Claims, 5 Drawing Sheets

(51) Int. Cl.
*H01L 21/8234* (2006.01)
*H01L 29/423* (2006.01)
*H01L 27/088* (2006.01)

(58) Field of Classification Search
CPC ......... H01L 29/42384; H01L 27/11246; H01L 27/1237; H01L 29/7856
See application file for complete search history.

(56) References Cited

U.S. PATENT DOCUMENTS

| | | |
|---|---|---|
| 6,855,994 B1 | 2/2005 | King |
| 9,196,695 B2 | 11/2015 | Yu |
| 9,887,301 B2 * | 2/2018 | Makiyama ........ H01L 27/11568 |
| 2013/0320483 A1 * | 12/2013 | Chen ................ H01L 21/76243 |
| | | 257/E21.563 |
| 2017/0084736 A1 * | 3/2017 | Toh .................... H01L 29/7816 |

* cited by examiner

HIGH VOLTAGE SEMICONDUCTOR DEVICE INCLUDING BURIED OXIDE LAYER AND METHOD FOR FORMING THE SAME

BACKGROUND OF THE INVENTION

1. Field of the Invention

The present invention is related to a semiconductor device and a method for forming the same. More particularly, the present invention is related to a semiconductor device including a buried oxide layer and a method for forming the same.

2. Description of the Prior Art

In advanced semiconductor technology, various devices having different driving voltages may be integrally formed in a same chip for reducing production cost, enhancing performance and also achieving a lower power consumption to meet the needs of various products.

A high voltage (HV) device usually includes a thicker gate dielectric layer to sustain a higher operation voltage. However, the thicker gate dielectric layer may cause the gate height of the HV device (the height of the gate structure) to be different from that of other devices, which may increase the difficulty of process control. Therefore, how to successfully and conveniently integrating HV devices and other semiconductor devices on the same chip in a larger process window is an important research topic in the field.

SUMMARY OF THE INVENTION

In light of the above, the present invention intends to provide a semiconductor device and method for forming the same, which may increase the process window to integrally form high voltage devices and other semiconductor devices on the same chip. Specifically, the semiconductor device provided by the present invention includes a buried oxide layer selectively formed in a high voltage device region of a semiconductor substrate through an oxygen implantation process. The buried oxide may be used to form a high voltage semiconductor device. In this way, the gate heights of the high voltage semiconductor device and other semiconductor devices may be more consistent, which may yield a larger process window and simplify the process steps.

According to an embodiment of the present invention, a semiconductor device is disclosed. The semiconductor device includes a substrate, a buried oxide layer in the substrate and near a surface of the substrate, a gate dielectric layer on the substrate and covering the buried oxide layer, a gate structure disposed on the gate dielectric layer and overlapping the buried oxide layer, and a source region and a drain region in substrate and respectively at two sides of the gate structure.

According to another embodiment of the present invention, a method for forming a semiconductor device is disclosed. The method includes the steps of providing a substrate, performing an oxygen implantation process to form an oxygen-rich layer in the substrate and near a surface of the substrate, performing a rapid thermal process to convert the oxygen-rich layer into a buried oxide layer, forming a gate dielectric layer on the substrate and covering the buried oxide layer, and forming a gate structure on the gate dielectric layer and overlapping the buried oxide layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic cross-sectional drawings showing the steps of a method for forming a semiconductor device according to one embodiment of the present invention, in which:

FIG. 1 illustrates the step of providing a substrate for forming the semiconductor device;

FIG. 2 illustrates the step of forming isolation regions in the substrate;

FIG. 3 illustrates the step of forming wells in the substrate;

FIG. 4 illustrates the step of forming an oxygen-rich layer in the substrate;

FIG. 5 illustrates the step of forming a buried oxide layer in the substrate;

FIG. 6 illustrates the step of forming a gate dielectric layer on the substrate;

FIG. 7 illustrates the step of partially removing the gate dielectric layer;

FIG. 8 illustrates the step of forming another gate dielectric layer on the substrate; and FIG. 9 illustrates the step of forming gate structures on the substrates and source regions, drain regions, a drift region, and a well pick up doped region in the substrate.

DETAILED DESCRIPTION

Figure 1:
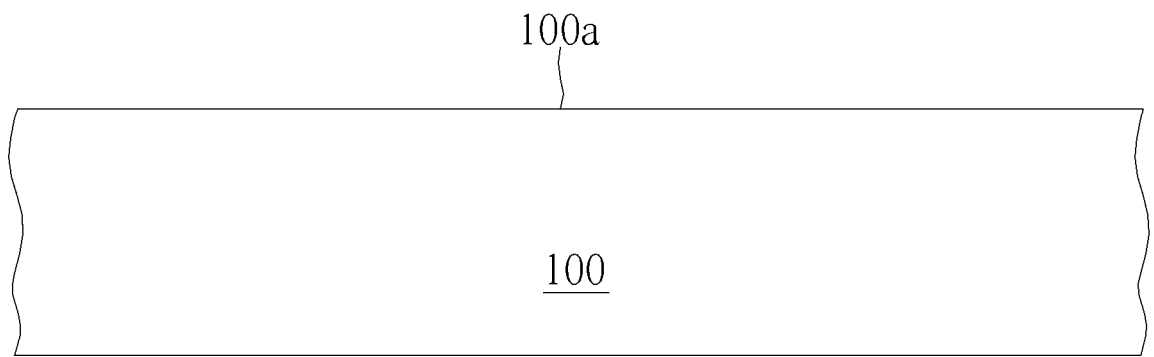

To provide a better understanding of the present invention to those of ordinary skill in the art, several exemplary embodiments of the present invention will be detailed as follows, with reference to the accompanying drawings using numbered elements to elaborate the contents and effects to be achieved.

The accompanying drawings are included to provide a further understanding of the embodiments, and are incorporated in and constitute a part of this specification. For ease of understanding, same reference numerals are used to indicate the same elements in the drawings. It should be understood that the elements disclosed in one embodiment may be used in other embodiments without specific description. It is noted that, for purposes of illustrative clarity and being easily understood by the readers, various drawings of the present show a portion of the semiconductor device, and certain components in various drawings may not be drawn to scale unless being specifically specified. The number and dimension of each component shown in drawings are only illustrative and are not intended to limit the scope of the present disclosure. The drawings may be simplified and some details or elements may be omitted.

These embodiments are described in sufficient detail to enable those skilled in the art to practice the invention. Other embodiments may be utilized and that structural, logical and electrical changes may be made without departing from the spirit and scope of the present invention.

FIG. 1 to FIG. 9 are schematic cross-sectional drawings showing the steps of a method for forming a semiconductor device according to one embodiment of the present invention.

Please refer to FIG. 1. At the beginning of the method, a substrate 100 is provided. The substrate 100 may be a silicon substrate, an epitaxial silicon substrate, a silicon germanium (SiGe) semiconductor substrate, a silicon carbide (SiC) substrate, or a silicon-on-insulator (SOI) substrate, but is not limited thereto. The substrate 100 may include a surface 100a. According to an embodiment, the substrate 100 may have a conductivity type.

Figure 2:
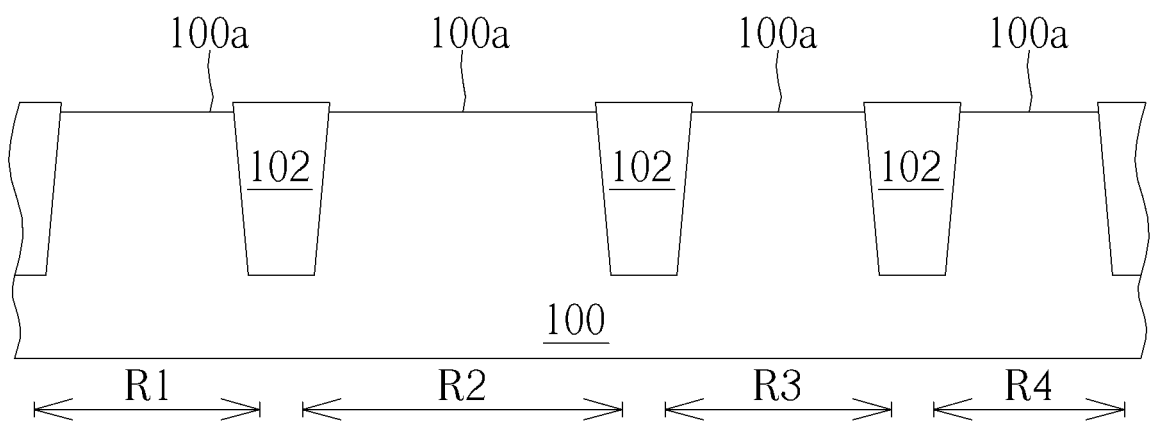

Please refer to FIG. 2. Subsequently, a plurality of isolation regions 102 may be formed in the substrate 100 to define a first device region R1, a second device region R2, a third device region R3, and a fourth device region R4 in the substrate 100, which are used to fabricate semiconductor devices having different driving voltages. It should be noted that the first device region R1, the second device region R2, the third device region R3, and the fourth device region R4 are shown to be closely arranged in the drawings for the purpose of convenience of drawing and description, and should not be used as a limitation to the present invention. In practice, the locations of the first device region R1, the second device region R2, the third device region R3, and the fourth device region R4 in the substrate 100 may be designed according to product needs.

Figure 3:
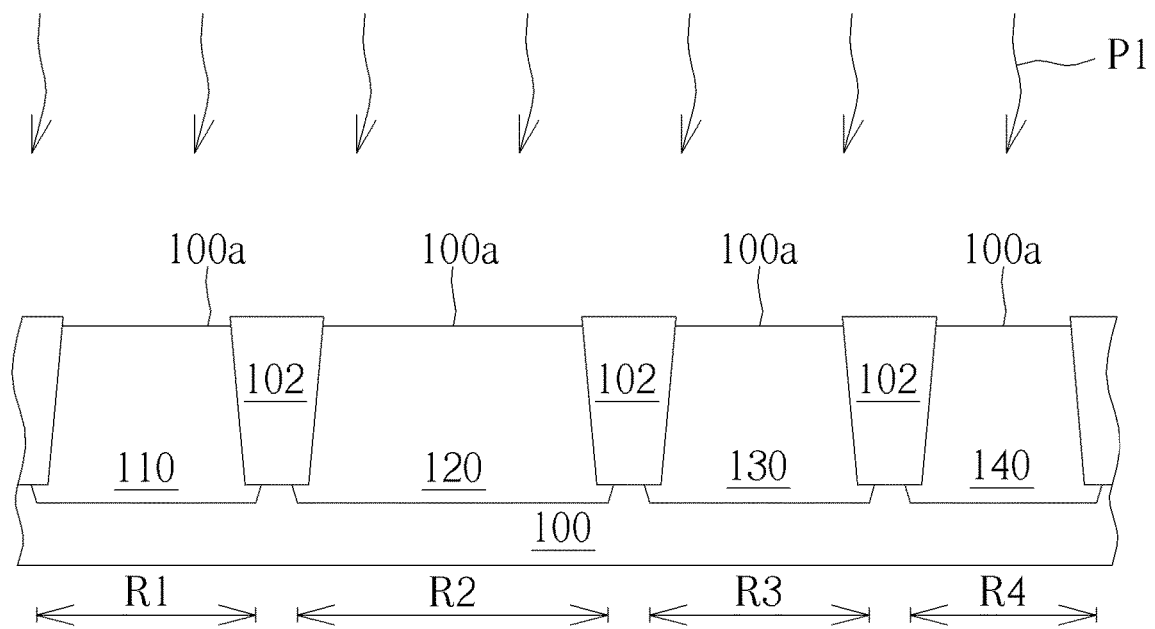

Please refer to FIG. 3. Subsequently, an implantation process P1 or a plurality of implantation processes may be performed to the substrate 100 to form a first well 110 in the first device region R1, a second well 120 in the second device region R2, a third well 130 in the third device region R3, and a fourth well 140 in the fourth device region R4. The first well 110, the second well 120, the third well 130, and the fourth well 140 may have a same conductivity type or different conductivity types. For example, the first well 110, the second well 120, the third well 130, and the fourth well 140 may respectively have a first conductivity type or a second conductivity type that is complementary to the first conductivity type. According to an embodiment, the first conductivity type may be N type, and the second conductivity type may be P type. The first well 110, the second well 120, the third well 130, and the fourth well 140 may respectively be an N well or a P well, but are not limited thereto. The species of dopants, concentrations of dopants and depths of dopants of the wells may be adjusted according to product needs.

Figure 4:
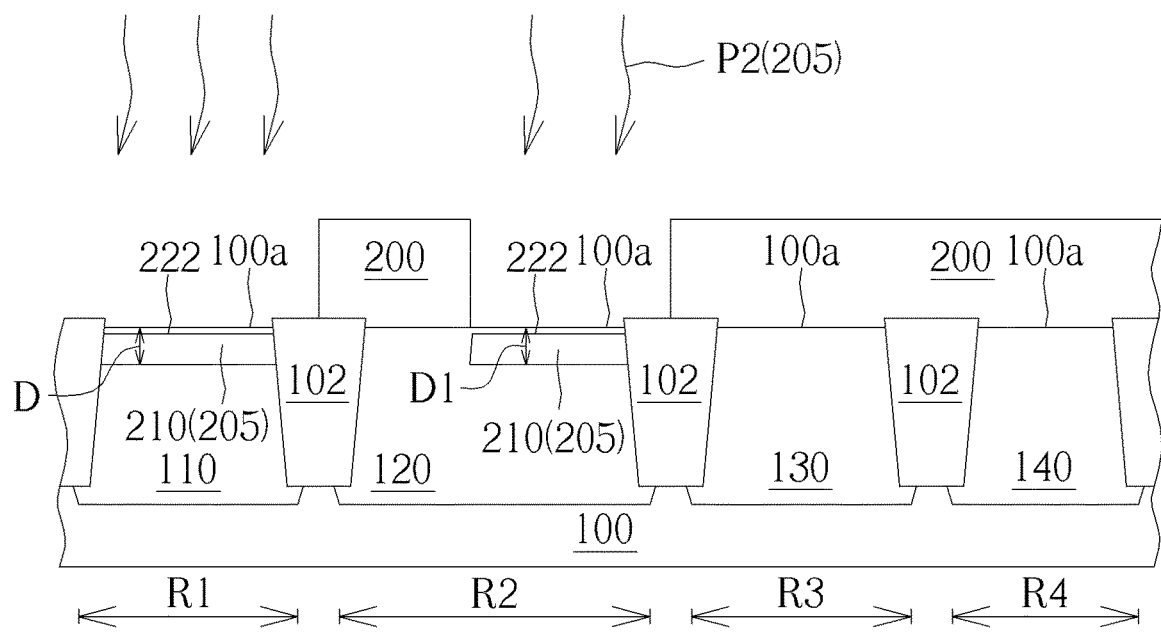

Please refer to FIG. 4. Subsequently, a first patterned mask layer 200 may be formed on the substrate 100 and covers a portion of the substrate 100. The first patterned mask layer 200 may be a patterned photoresist layer, but is not limited thereto. According to an embodiment of the present invention, the first patterned mask layer 200 covers the entire third device region R3 and the fourth device region R4, and exposes all of the first device region R1 and a portion of the second device region R2.

Please continue to refer to FIG. 4. Following, an oxygen implantation process P2 may be performed to the substrate 100, using the first patterned mask layer 200 as an implantation mask to implant dopants including oxygen-containing species 205 into the first device region R1 and the second device region R2 that are exposed from the first patterned mask layer 200, thereby forming an oxygen-rich layer 210 including the oxygen-containing species 205 respectively in the first device region R1 and the second device region R2.

According to an embodiment of the present invention, the oxygen-containing species 205 may include at least one of oxygen atoms, oxygen ions, oxygen radicals, oxygen molecules, oxygen containing compounds, or a combination thereof, but is not limited thereto.

According to an embodiment of the present invention, the implant energy of the oxygen-containing species 205 during the oxygen implantation process P2 may be between 10 keV and 30 keV, but is not limited thereto. According to an embodiment of the present invention, a concentration of the oxygen-containing species 205 in the oxygen-rich layer 210 may be between 1E15 atoms/cm$^3$ and 1E16 atoms/cm$^3$, but is not limited thereto. According to an embodiment of the present invention, the depth D1 of the bottom portion of the oxygen-rich layer 210 below the surface 100a of the substrate 100 may be between 150 Å and 200 Å.

According to an embodiment of the present invention, the implanted oxygen-containing species 205 may penetrate a portion of the thickness of the substrate 100 to reach a predetermined region of the substrate 100 where the oxygen-rich layer 210 is to be formed. Accordingly, as shown in FIG. 4, the oxygen-rich layer 210 may be covered by a thin layer 222 of the substrate 100. The surface of the thin layer 222 is substantially the surface 100a of the substrate 100. The concentration of the oxygen-containing species 205 in the thin layer 222 is significantly lower than the concentration of the oxygen-containing species 205 in the oxygen-rich layer 210. According to an embodiment of the present invention, the thin layer 222 may include only a small portion of the implanted oxygen-containing species 205. According to other embodiments of the present invention, the thin layer 222 may include almost no oxygen-containing species 205 and has substantially the same composition as the substrate 100, such as silicon.

Figure 5:
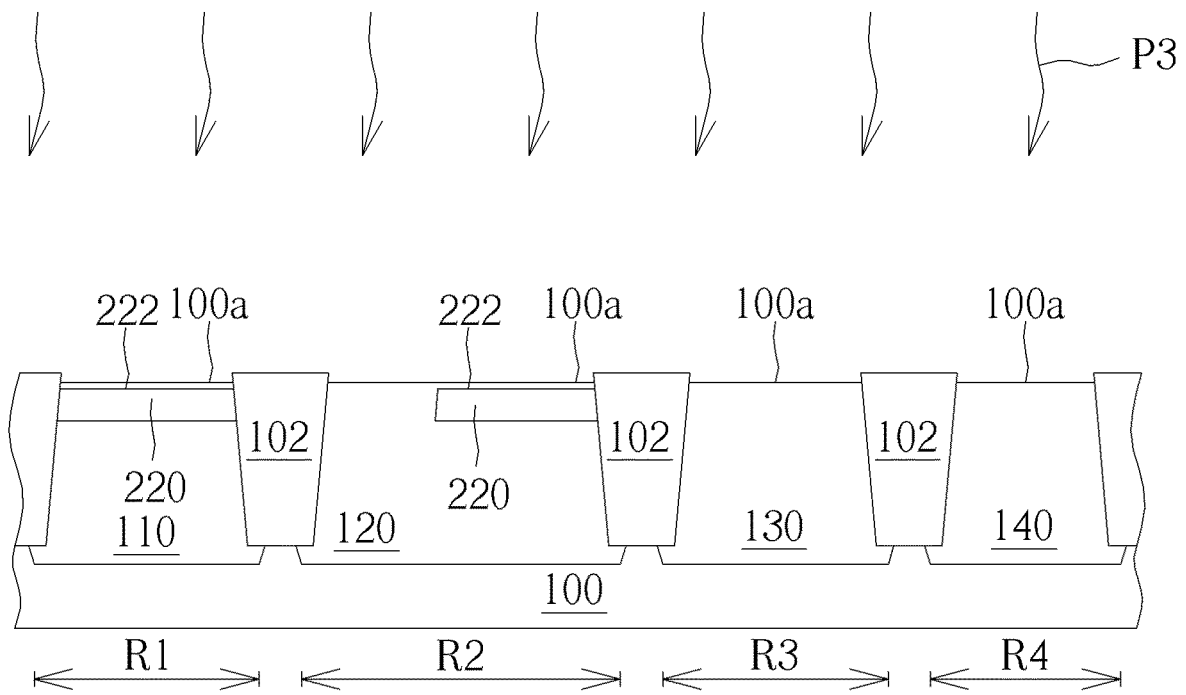

Please refer to FIG. 5. After removing the first patterned mask layer 200, a rapid thermal process P3 may be performed to the substrate 100 in an inert gas ambient to make the oxygen-containing species 205 of the oxygen-rich layer 210 react with the material of the substrate 100, thereby converting the oxygen-rich layer 210 into a buried oxide layer 220. According to an embodiment of the present invention, the inert gas ambient may be obtained by supplying inert gas, such as nitrogen ($N_2$) or argon (Ar), into the processing chamber of the rapid thermal process P3.

According to an embodiment of the present invention, a processing temperature of the rapid thermal process P3 may be between 850° C. and 1050° C., and a processing time of the rapid thermal process P3 may be between 1 minute and 5 minutes, but are not limited thereto. According to an embodiment of the present invention, the rapid thermal process P3 may activate the dopants in the first well 110, the second well 120, the third well 130, and the fourth well 140 and repair the damaged portion of the substrate 100 during the implantation process P1 and the oxygen implantation process P2.

According to an embodiment of the present invention, since the thin layer 222 includes only a small amount of the oxygen-containing species 205 or substantially no oxygen-containing species 205, only a little portion or almost none of the thin layer 222 may be converted into oxide during the rapid thermal process P3. Accordingly, after the rapid thermal process P3, the thin layer 22 may still exist and cover the buried oxide layer 220.

According to an embodiment of the present invention, the buried oxide layer 220 may include some unreacted oxygen-containing species 205 after the rapid thermal process P3.

Figure 6:
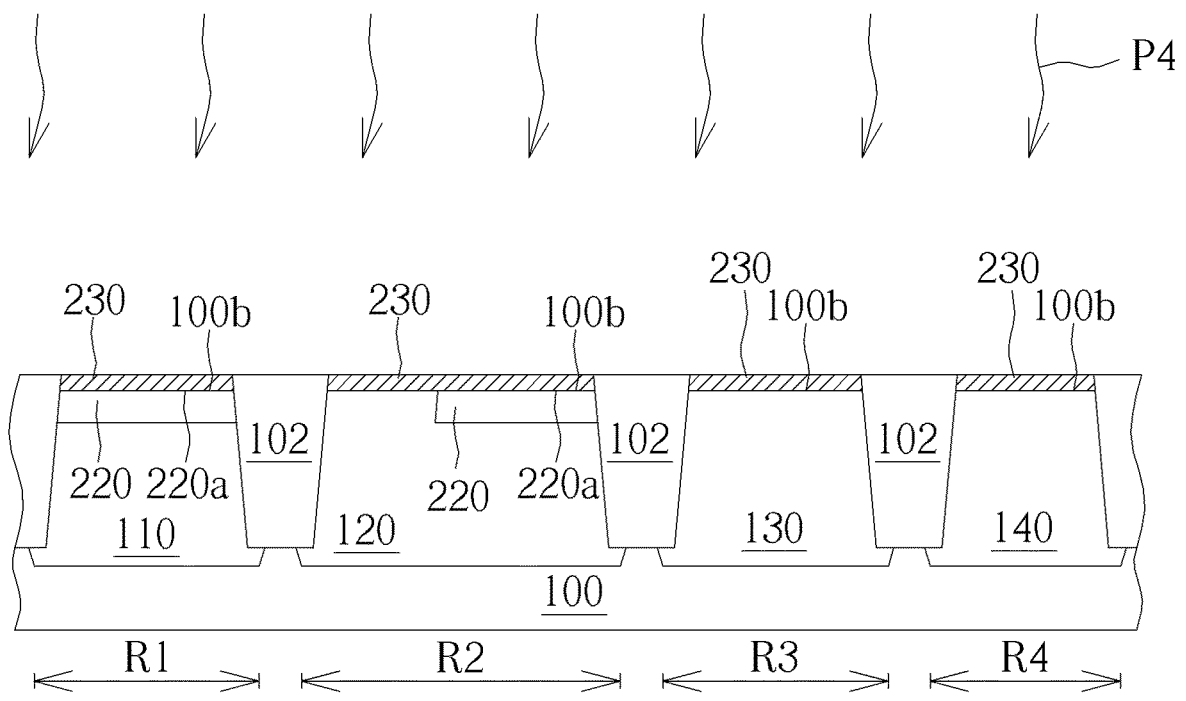

Please refer to FIG. 6. Subsequently, a thermal oxidation process P4 may be performed to the substrate 100 in an oxygen ambient to form a gate dielectric layer 230 on the first device region R1, the second device region R2, the third device region R3, and the fourth device region R4. The gate dielectric layer 230 covers the surface 100b of the substrate 100 and the surface 220a of the buried oxide layer 220.

According to an embodiment of the present invention, the oxygen ambient may be obtained by supplying oxygen or oxygen-containing gas (such as water vapor) into the processing chamber of the thermal oxidation process P4. According to an embodiment of the present invention, the thermal oxidation process P4 may include in-situ steam generation (ISSG) oxidation process, wet furnace oxidation process, or dry furnace oxidation process, but is not limited thereto.

It should be noted that, the thin layer 222 on the buried oxide layer 220 in the first device region R1 and the second device region R2 and a surface layer of the substrate 100 in the third device region R3 and the fourth device region R4 may be oxidized during the thermal oxidation process P4 to become a portion of the gate dielectric layer 230. As a result, the interface (that is, the surface 100b of the substrate 100) between the gate dielectric layer 230 and the substrate 100 may be substantially flush with or lower than the surface 100a of the substrate 100 before performing the thermal oxidation process P4. According to an embodiment of the present invention, the surface 100b of the substrate 100 may be substantially flush with the surface 220a of the buried oxide layer 220.

Figure 7:
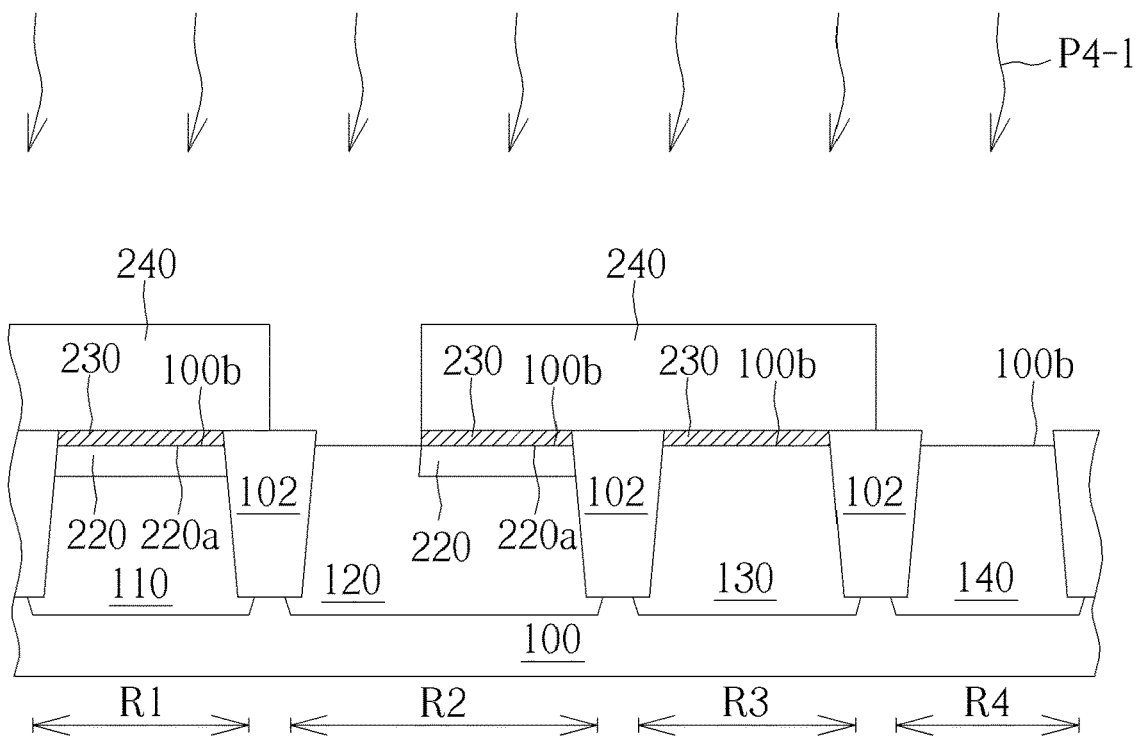

Please refer to FIG. 7. Subsequently, a second patterned mask layer 240 may be formed and cover a portion of the substrate 100. The second patterned mask layer 240 may be a patterned photoresist layer, but is not limited thereto. According to an embodiment of the present invention, the second patterned mask layer 240 completely covers the first device region R1 and the third device region R3, and exposes all of the fourth device region R4 and a portion of the second device region R2.

Please continue to refer to FIG. 7. Following, an etching process P4-1 may be performed to the substrate 100, using the second patterned mask layer 240 as an etching mask to etch away the portion of the gate dielectric layer 230 exposed from the second patterned mask layer 240. After the etching process P4-1, all of the surface 100b of the substrate 100 in the fourth device region R4 and a portion of the surface 100b of the substrate 100 in the second device region R2 may be exposed.

Figure 8:
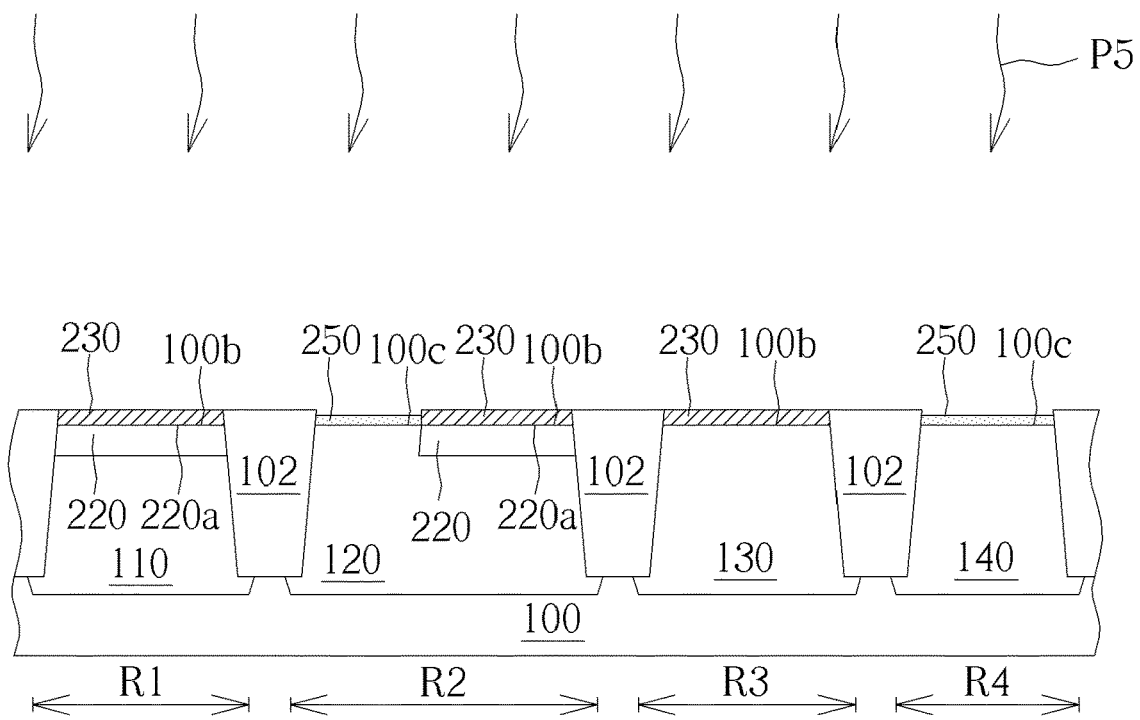

Please refer to FIG. 8. After removing the second patterned mask layer 240, another thermal oxidation process P5 may be performed to the substrate 100 in an oxygen ambient to form a dielectric layer 250 on the exposed portion of the substrate 100 in the fourth device region R4 and the second device region R2. As shown in FIG. 8, the dielectric layer 250 covers the surface 100c of the substrate 100 and adjoins the dielectric layer 230. According to an embodiment of the present invention, the thermal oxidation process P5 may include in-situ steam generation (ISSG) oxidation process, wet furnace oxidation process, or dry furnace oxidation process, but is not limited thereto.

It should be noted that, a surface layer of the substrate 100 exposed from the buried oxide layer 220 may be oxidized during the thermal oxidation process P5 to become a portion of the gate dielectric layer 250. As a result, the interface (that is, the surface 100c of the substrate 100) between the gate dielectric layer 250 and the substrate 100 may be substantially flush with or lower than the surface 100b of the substrate 100.

The gate dielectric layer 230 and the gate dielectric layer 250 may have different thicknesses. According to an embodiment of the present invention, the gate dielectric layer 230 may have a thickness of 30 to 50 angstroms, and the gate dielectric layer 250 may have a thickness of 10 to 15 angstroms, but are not limited thereto.

Figure 9:
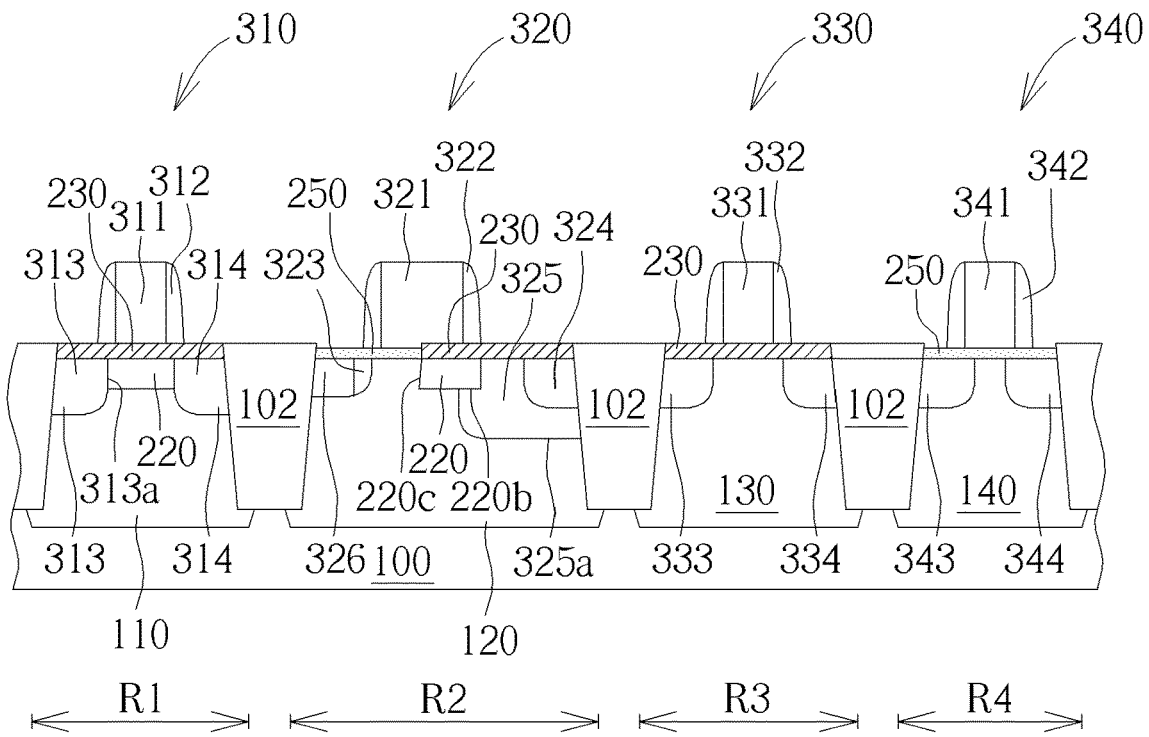

Please refer to FIG. 9. Subsequently, semiconductor processes such as thin film deposition, photolithography, etching, and ion implantation may be performed to the substrate 100 to form a first semiconductor device 310 in the first device region R1, a second semiconductor device 320 in the second device region R2, a third semiconductor device 330 in the third device region R3, and a fourth semiconductor device 340 in the fourth device region R4.

Specifically speaking, as shown in FIG. 9, the first semiconductor device 310 in the first device region R1 may include the substrate 100, the buried layer 220 formed in the substrate 100 and near the surface of the substrate 100, and the gate dielectric layer 230 disposed on the substrate 100 and covering the buried layer 220. The first semiconductor device 310 further includes a gate structure 311 disposed on the gate dielectric layer 230 and vertically overlapping the buried oxide layer 220, a pair of spacers 312 disposed on two sidewalls of the gate structure 311, and a source region 313 and a drain region 314 of the same conductivity type formed in the substrate 100 and respectively at two sides of the gate structure 311. The buried oxide layer 220 of the first semiconductor device 310 may directly contact a side edge 313a of the source region 313 and a side edge 314a of the drain region 314. According to an embodiment of the present invention, the buried oxide layer 220, the source region 313 and the drain region 314 may be formed in the first well 110 of the substrate 100. The conductivity type of the well 110 may be complementary to the conductivity type of the source region 313 and the drain region 314. For example, the source region 313 and the drain region 314 may have the first conductivity type (such as N type), and the well 110 may have the second conductivity type (such as P type), and vice versa. According to an embodiment of the present invention, the first semiconductor device 310 may be used as a medium voltage (MV) device. The operation voltage of the first semiconductor device 310 may be between 10V and 250V, but is not limited thereto.

The second semiconductor device 320 in the second device region R2 may include the substrate 100, the buried layer 220 formed in the substrate 100 and near the surface of the substrate 100, and a gate dielectric layer including the gate dielectric layer 230 (the first portion) and the gate dielectric layer 250 (the second portion) disposed on the substrate 100, wherein the gate dielectric layer 230 (the first portion) is directly disposed on the buried oxide layer 220 and the gate dielectric layer 250 (the second portion) is directly disposed on the substrate 100. The second semiconductor device 320 further includes a gate structure 321 disposed on the gate dielectric layer 230 and the gate dielectric layer 250 and vertically overlapping a boundary 220c between the substrate 100 and the buried oxide layer 220. The gate structure 321 also overlaps a boundary between the gate dielectric layer 230 and the gate dielectric layer 250. A pair of spacers 312 may be disposed on two sidewalls of the gate structure 321, and a source region 323 and a drain region 324 of the same conductivity type are formed in the substrate 100 and respectively at two sides of the gate structure 321. A drift region 325 may be formed in the substrate 100 and between the gate structure 321 and the drain region 324, and may surround the drain region 324 and a portion of the lower edge 220b of the buried oxide layer 220. The side edges 220c of the buried oxide layer 220 of the second semiconductor device 320 are spaced apart from the source region 323 and the drain region 324 by the substrate 100 and the drift region 325, respectively, and are not in direct contact with the source region 323 and the drain region 324. The conductivity type of the drift region 325 may be the same as the conductivity type of the source region 323 and the source region 324. According to an embodiment of the present invention, the buried oxide layer 220, the source region 323, the drain region 324, and the drift region 325 may be formed in the second well 120 of the substrate 100. The conductivity type of the second well 120 is different from the conductivity type of the source region 323, the drain region 324, and the drift region 325. For example, the source region 323, the drain region 324, and the drift region 325 may have the first conductivity type (such as N type), and the second well 120 may have the second conductivity type (such as P type), and vice versa.

According to an embodiment of the present invention, the second semiconductor device 320 may further include a well pick up doped region 326 formed in the substrate 100 at the same side as the source region 323. The well pick up doped region 326 may have a conductivity type the same as the second well 120. According to an embodiment of the present invention, the second semiconductor device 320 may be used as a high voltage (HV) device. The operation voltage of the second semiconductor device 320 may be between 40V and 900V, but is not limited thereto.

The third semiconductor device 330 in the third device region R3 may include the substrate 100, the gate dielectric layer 230 disposed on the substrate 100, the gate structure 331 disposed on the gate dielectric layer 230, a pair of spacers 322 disposed on two sidewalls of the gate structure 331, and the source region 333 and the drain region 334 of the same conductivity type formed in the substrate 100 at two sides of the gate structure 331.

The fourth semiconductor device 340 in the fourth device region R4 may include the substrate 100, the gate dielectric layer 250 disposed on the substrate 100, the gate structure 341 disposed on the gate dielectric layer 250, a pair of spacers 342 disposed on two sidewalls of the gate structure 341, and the source region 343 and the drain region 344 of the same conductivity type formed in the substrate 100 at two sides of the gate structure 341. According to an embodiment of the present invention, the source region 343 and the drain region 344 may be formed in the fourth well 140 of the substrate 100. The conductivity type of the fourth well 140 is different from the conductivity type of the source region 343, the drain region 344. For example, the source region 343 and the drain region 344 may have the first conductivity type (such as N type), and the fourth well 140 may have the second conductivity type (such as P type), and vice versa. According to an embodiment of the present invention, the fourth semiconductor device 340 may be used as a core device. The operation voltage of the fourth semiconductor device 340 may be between 0.8V and 1.2V, but is not limited thereto.

One feature of the present invention is that, by performing the oxygen implantation process to form the buried oxide layer 220 in the substrate 100 of the first semiconductor device 310 and the substrate 100 of the second semiconductor device 320, the first semiconductor device 310 and the substrate 100 of the second semiconductor device 320 may have increased effective gate dielectric thicknesses and breakdown voltages, allowing them to operation properly under higher operating voltages.

Figure 10:
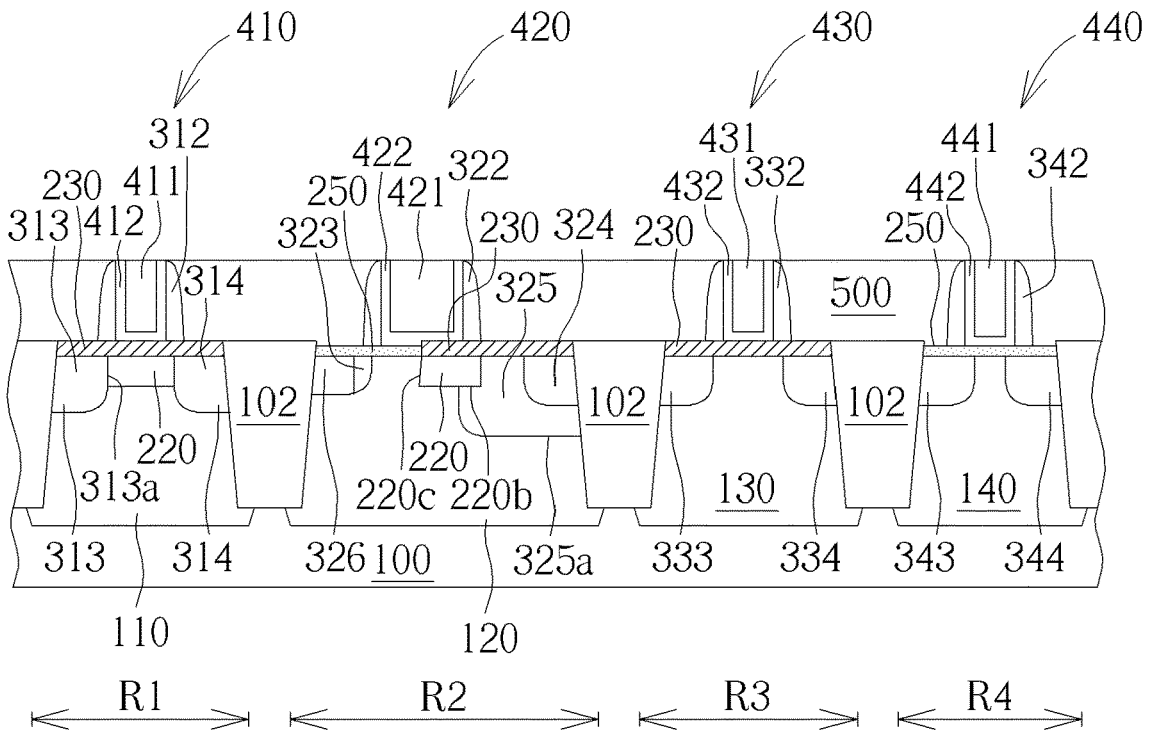
FIG. 10 is a schematic cross-sectional drawing of a semiconductor device according to another embodiment of the present invention.

Please refer to FIG. 10, which is a schematic cross-sectional drawing of a semiconductor device according to another embodiment of the present invention. A difference between the embodiment shown in FIG. 10 and the embodiment shown in FIG. 9 is that, the first semiconductor device 410, the second semiconductor device 420, the third semiconductor device 430, and the fourth semiconductor device 440 include metal gates.

Specifically speaking, after the step shown in FIG. 9, an interlayer dielectric layer 500 may be formed on the substrate 100 in a blanket manner, and then a chemical mechanical polishing (CMP) process may be performed to the substrate 100 to remove a portion of the interlayer dielectric layer 500 until the top portions of the first gate structure 311, the second gate structure 321, the third gate structure 331, and the fourth gate structure 341 are exposed from the interlayer dielectric layer 500. Subsequently, a replacement metal gate (RMG) process may be performed to form the metal gates. For example, the RMG process may include performing a selective etching process (for example, a wet etching process) to remove the first gate structure 311, the second gate structure 321, the third gate structure 331, and the fourth gate structure 341 to form a plurality of gate trenches in the interlayer dielectric layer 500. Following, high-k dielectric layers (not shown), the work function metal layers 412, 422, 432, and 442, and the low resistant metal layers 441, 421, 431 and 441 may be successively formed on interlayer dielectric layer 500 and filling into the gate trenches. Chemical mechanical polishing processes may be performed to remove the overburden or excess high-k dielectric layers, the work function metal layers 412, 422, 432, and 442, and the low resistant metal layers 441, 421, 431 and 441 outside the gate trenches, thereby obtaining the first semiconductor device 410, the second semiconductor device 420, the third semiconductor device 430, and the fourth semiconductor device 440 as shown in FIG. 10.

Instead of conventional technology uses thermal oxidation process to form a thicker gate dielectric layer to provide a larger effective gate dielectric thicknesses, the present invention uses the oxygen implantation process P2 to form the buried oxide layer 220 in the substrate 100 of the first semiconductor device 310 and the substrate 100 of the second semiconductor device 320 to increase the effective gate dielectric thicknesses of the first semiconductor device 310 and the second semiconductor device 320, respectively. In this way, the gate heights of the gate structure 311 of the first semiconductor device 310, the gate structure 321 of the second semiconductor device 320, the gate structure 331 of the third semiconductor device 330 and the gate structure 341 of the fourth semiconductor device 340 may be more consistent with each other, which may help to increase the process window of following replacement metal gate process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for forming a semiconductor device, comprising:
providing a substrate;
performing an oxygen implantation process to form an oxygen-rich layer in the substrate and covered by a thin layer of the substrate;
performing a rapid thermal process to convert the oxygen-rich layer into a buried oxide layer;
performing a thermal oxidation process to oxidize the thin layer of the substrate to form a gate dielectric layer on the substrate and covering the buried oxide layer, wherein the buried oxide layer is in direct contact with the gate dielectric layer; and forming a gate structure on the gate dielectric layer and overlapping the buried oxide layer.

2. The method for forming a semiconductor device according to claim 1, wherein the oxygen implantation process comprises implanting oxygen-containing species into the substrate to form the oxygen-rich layer, wherein the oxygen-containing species comprises at least one of oxygen atoms, oxygen ions, oxygen radicals, oxygen molecules, and oxygen containing compounds.

3. The method for forming a semiconductor device according to claim 2, wherein a concentration of the oxygen-containing species is between 1E15 atoms/cm$^3$ and 1E16 atoms/cm$^3$.

4. The method for forming a semiconductor device according to claim 2, wherein an implantation energy of the oxygen-containing species is between 10 keV and 30 keV.

5. The method for forming a semiconductor device according to claim 1, wherein the rapid thermal process is performed in an inert gas ambient.

6. The method for forming a semiconductor device according to claim 1, wherein a processing temperature of the rapid thermal process is between 850° C. and 1050° C., and a processing time of the rapid thermal process is between 1 minute and 5 minutes.

7. The method for forming a semiconductor device according to claim 1, wherein the thermal oxidation process is performed in an oxygen ambient.

8. The method for forming a semiconductor device according to claim 1, further comprising:

forming a source region and a drain region in the substrate at two sides of the gate structure; and forming a drift region in the substrate and between the gate structure and the drain region, wherein a lower edge of the drift region is lower than a lower edge of the buried oxide layer.

9. The method for forming a semiconductor device according to claim 1, wherein the gate structure overlaps a boundary between the buried oxide layer and the substrate.

* * * * *